(12) United States Patent
Shimao et al.

(10) Patent No.: US 8,541,928 B2
(45) Date of Patent: Sep. 24, 2013

(54) QUARTZ-CRYSTAL DEVICES EXHIBITING REDUCED CRYSTAL IMPEDANCE

(75) Inventors: Kenji Shimao, Saitama (JP); Takehiro Takahashi, Saitama (JP); Hiroyuki Sasaki, Saitama (JP); Manabu Ishikawa, Saitama (JP); Shinobu Yoshida, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 29 days.

(21) Appl. No.: 13/419,074

(22) Filed: Mar. 13, 2012

(65) Prior Publication Data

US 2012/0242193 A1 Sep. 27, 2012

(30) Foreign Application Priority Data

Mar. 23, 2011 (JP) .................................. 2011-063860
Jun. 16, 2011 (JP) .................................. 2011-134477
Sep. 1, 2011 (JP) .................................. 2011-190263

(51) Int. Cl.
*H01L 41/08* (2006.01)
(52) U.S. Cl.
USPC .......................................... 310/344; 310/348
(58) Field of Classification Search
USPC .................................................. 310/344, 348
See application file for complete search history.

(56) References Cited

U.S. PATENT DOCUMENTS

| | | | |
|---|---|---|---|
| 7,427,822 B2* | 9/2008 | Kusai | 310/344 |
| 7,990,026 B2* | 8/2011 | Otake | 310/344 |
| 8,093,785 B2* | 1/2012 | Wada | 310/340 |
| 8,278,798 B2* | 10/2012 | Ichikawa | 310/312 |
| 8,405,286 B2* | 3/2013 | Shimao et al. | 310/361 |
| 8,415,858 B2* | 4/2013 | Ishikawa et al. | 310/320 |

FOREIGN PATENT DOCUMENTS

JP 2010-062723 3/2010

\* cited by examiner

*Primary Examiner* — Mark Budd
(74) *Attorney, Agent, or Firm* — Klarquist Sparkman, LLP

(57) ABSTRACT

Quartz-crystal devices are disclosed, of which the CI value is reduced by adjusting the shortest distance between an edge of electrically conductive adhesive and an edge of the excitation electrode. The device has a quartz-crystal plate having long-edges and short-edges. Excitation electrodes are on first and second surfaces of the plate. Conductive pads are electrically connected to respective excitation electrodes and extend to the short-edge of the quartz-crystal plate. A package having a pair of external mounting terminals and respective connecting electrodes are situated on opposing sides of the mounting terminals for making electrical connections to the mounting terminals. An electrically conductive adhesive bonds the connecting terminals and respective conductive pads together, and the quartz-crystal plate onto the package. The shortest distance between an edge of the adhesive and an edge of the excitation electrode is 10%-15% the length of the quartz-crystal plate in the long-edge direction.

20 Claims, 19 Drawing Sheets

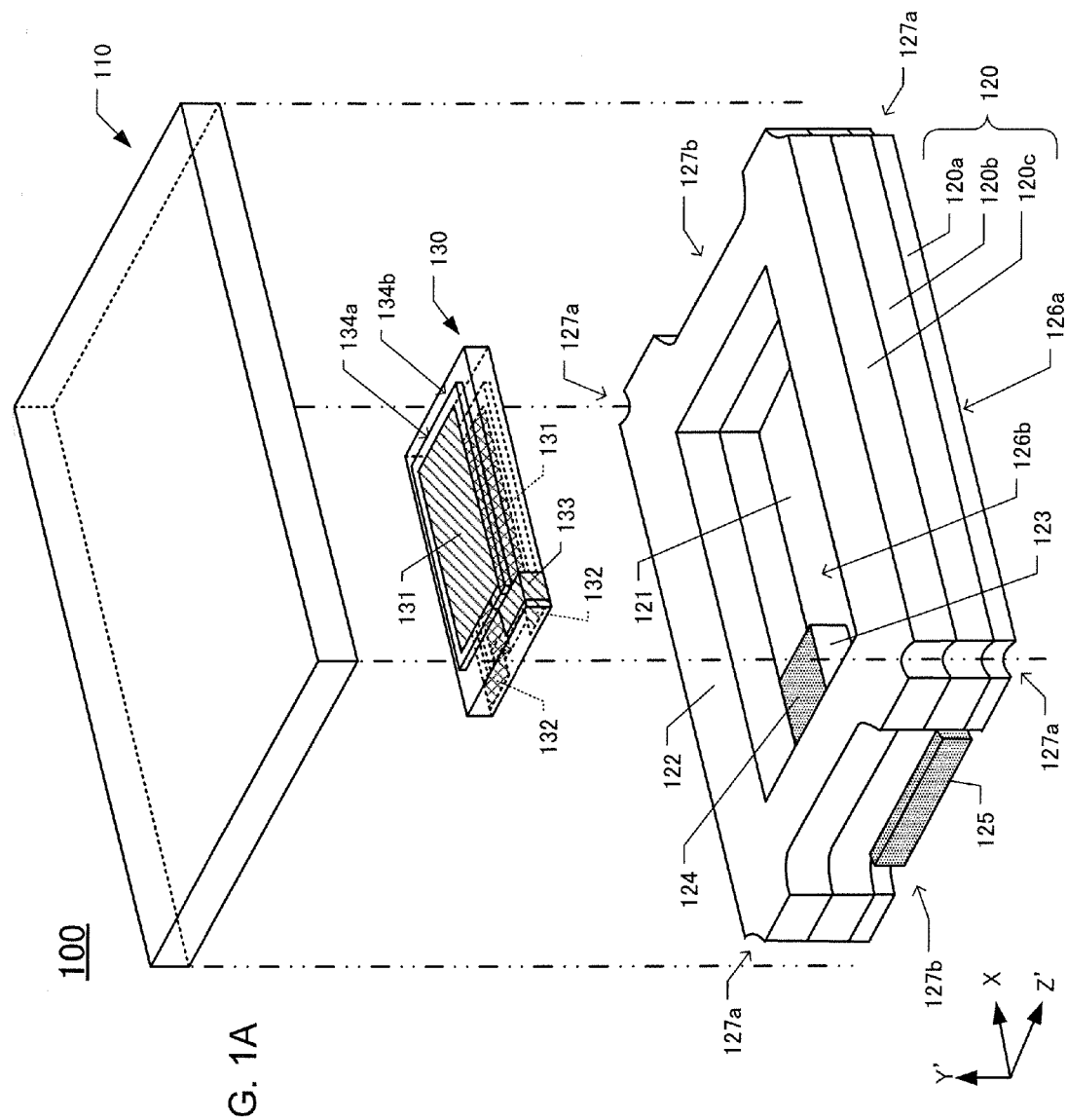

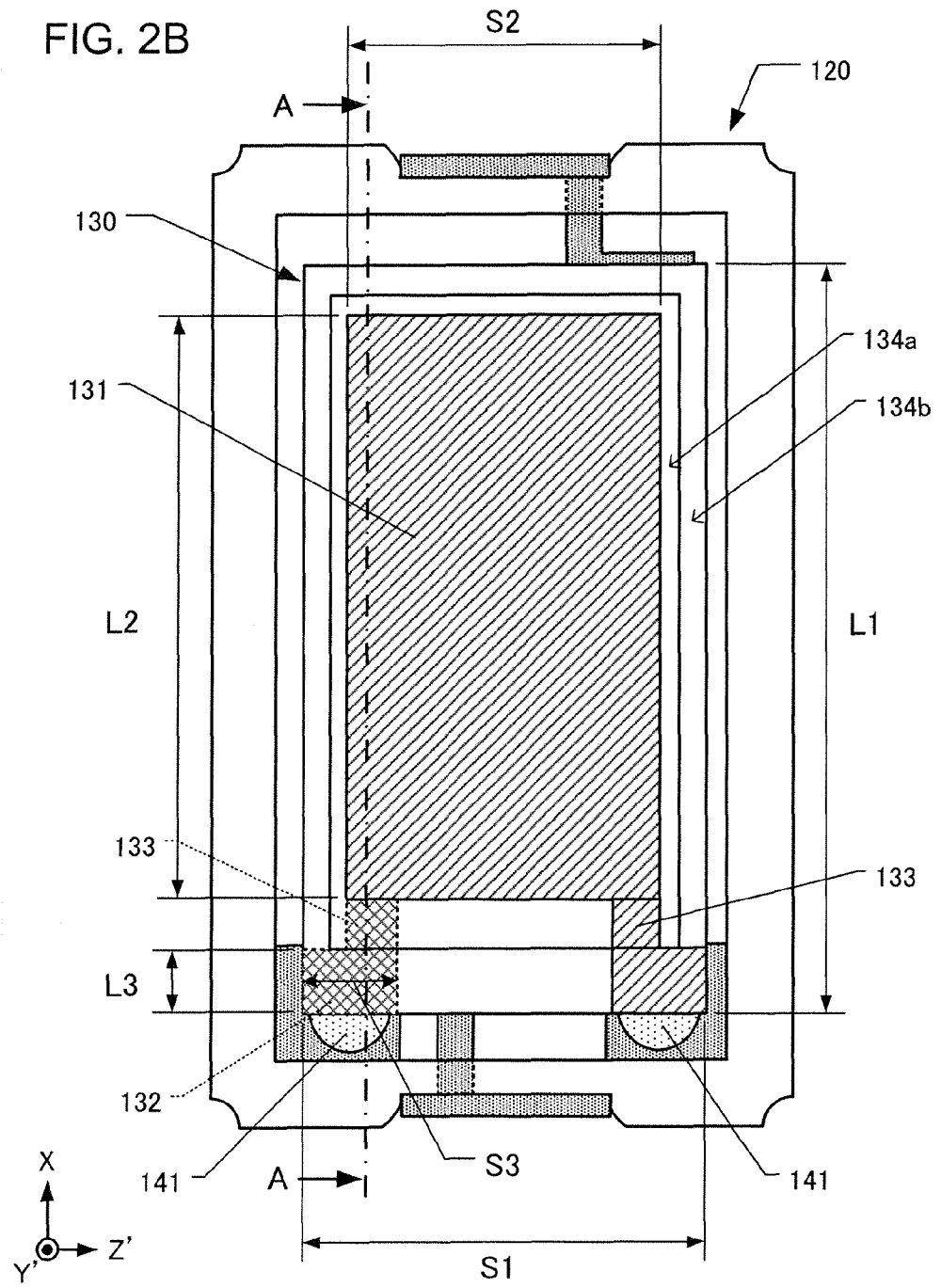

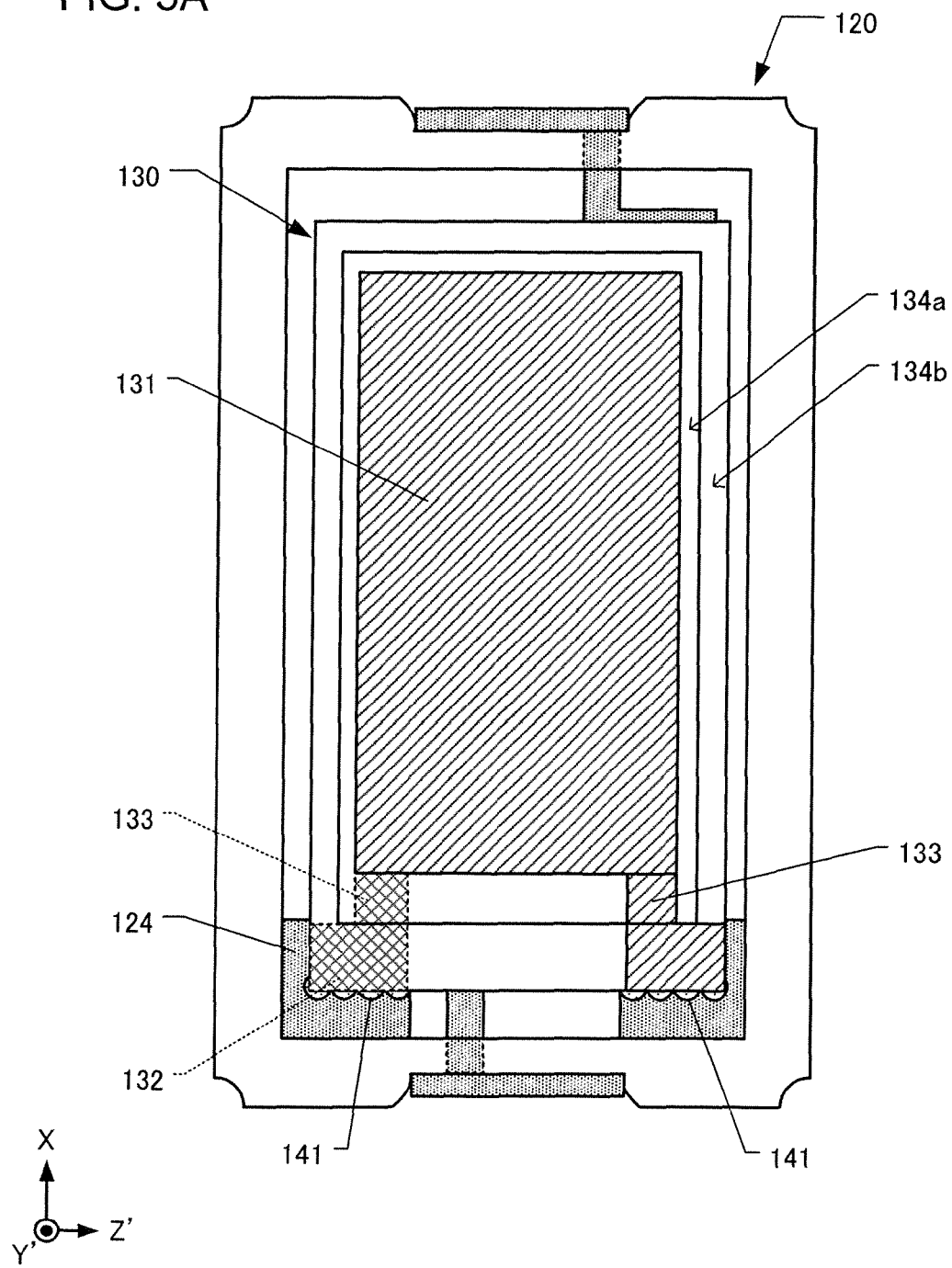

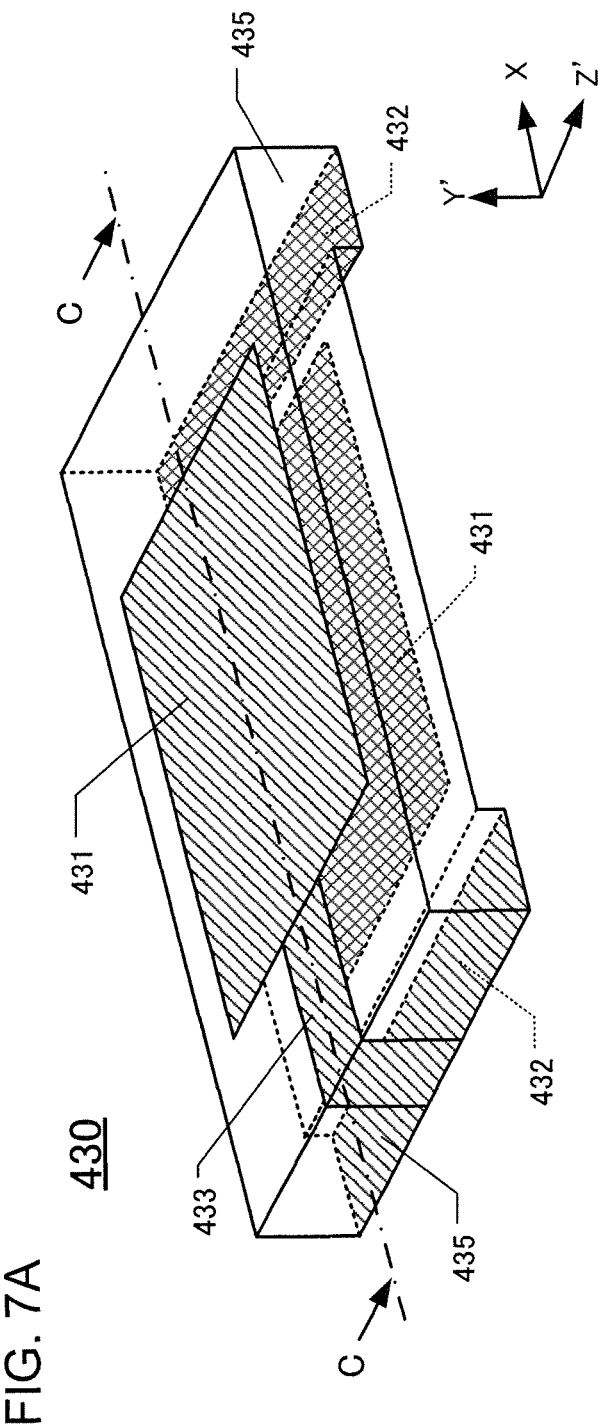

QUARTZ-CRYSTAL DEVICES EXHIBITING REDUCED CRYSTAL IMPEDANCE

CROSS-REFERENCE TO RELATED APPLICATIONS

This application claims priority to and the benefit of Japan Patent Application No. 2011-063860, filed on Mar. 23, 2011, Japan Patent Application No. 2011-134477, filed on Jun. 16, 2011, and Japan Patent Application No. 2011-190263, filed on Sep. 1, 2011, all in the Japan Patent Office, the disclosures of which are incorporated herein by reference in their respective entireties.

FIELD

The present invention relates to quartz-crystal devices having reduced CI (crystal impedance).

DESCRIPTION OF THE RELATED ART

In a conventional quartz-crystal device, excitation electrodes and conductive pads are situated on a quartz-crystal plate, and the quartz-crystal plate is bonded onto (and in) a package using electrically conductive adhesive. Preferably, the conductive pads and electrically conductive adhesive are bonded in conditions that do not increase the CI (crystal impedance) value. A CI increase would indicate a degraded vibration characteristic of the quartz-crystal plate.

In Japan Unexamined Patent Application No. 2010-062723, a mesa-type AT-cut quartz-crystal vibrating piece is disclosed that has a vibrating portion thicker than the peripheral portion. The vibrating piece exhibits reduced CI whenever the difference between the thickness of the AT-cut quartz-crystal vibrating piece and the shortest distance between the center of the vibrating portion of the vibrating piece and the outer periphery of the electrically conductive adhesive has been adjusted appropriately. However, the reduced CI disclosed in the '723 document relates only to a mesa-type AT-cut quartz-crystal vibrating piece, and does not apply to other types of piezoelectric substrates. Also, since CI can be adversely affected by various other conditions, it is desirable that CI be reduced by conditions other than thickness of the AT-cut quartz-crystal vibrating piece.

The present disclosure is directed to quartz-crystal devices, of which the CI value can be reduced by adjusting the shortest distance between an edge of the electrically conductive adhesive and an opposing edge of the excitation electrode.

SUMMARY

A first aspect of the invention is directed to quartz-crystal devices. An exemplary embodiment of such a device comprises a rectangular quartz-crystal plate contained in a package. The plate has a long-edge, a short-edge, a first main surface, and a second main surface. A respective excitation electrode is situated on each of the first and second main surfaces of the quartz-crystal plate. A respective conductive pad is electrically connected to each excitation electrode; the pad extends to the short-edge of the quartz-crystal plate. The package has a mounting surface, a pair of mounting terminals situated on the mounting surface, and respective connecting electrodes electrically connected to the respective mounting terminals. Respective units of electrically conductive adhesive bond together the connecting electrodes and respective conductive pads to thereby mount the quartz-crystal plate in the package. A shortest distance between an edge of a unit of electrically conductive adhesive and an opposing edge of the excitation electrode is in a range of 10% to 15% the length of the quartz-crystal plate in the long-edge direction.

The units of electrically conductive adhesive can be configured to bond the conductive pads to respective connecting terminals at multiple bonding locations. In such embodiments the conductive pads can be arranged along respective short-edge directions of the quartz-crystal plate, or along one short-edge direction. A cross-section of the surface facing the short-edge direction of the protrusion that is parallel to the principal surfaces of the quartz-crystal plate can include a portion of a circle having a center situated on the short-edge side of the protruding portion.

The bonding locations can be aligned along the short-edge direction. In such embodiments the conductive pads can be arranged along respective short-edge directions of the quartz-crystal plate, or along one short-edge direction.

In other embodiments the conductive pads are arranged along one edge of the quartz-crystal plate. A void is defined between the conductive pads, wherein the void extends through the quartz-crystal plate in a thickness direction.

In other embodiments the quartz-crystal plate comprises first and second principal surfaces on which respective excitation electrodes are situated. A step extends outward from a principal surface, and at least a portion of each conductive pad is located on the step. At least one respective unit of electrically conductive adhesive is bonded onto each conductive pad formed on the step, and the quartz-crystal plate is mounted in the package.

Various embodiments can further comprise a respective protrusion situated at each conductive pad. The protrusion separates the short-edge side of the quartz-crystal plate and the respective excitation electrode. The shortest distance between a surface facing the short-edge direction of the protrusion and an edge of the excitation electrode in the long-edge direction desirably is in a range of 10% to 15% the length of the long-edge of the quartz-crystal plate.

The conductive pads can be arranged along respective short-edge directions of the quartz-crystal plate, or along one short-edge direction. In such embodiments the quartz-crystal plate can comprise first and second principal surfaces on which respective excitation electrodes are situated. A step extends outward from a principal surface, and at least a portion of each conductive pad is located on the step. At least one respective unit of electrically conductive adhesive is bonded onto each conductive pad formed on the step, and the quartz-crystal plate is mounted in the package.

In certain embodiments the conductive pads are arranged along one edge of the quartz-crystal plate. A void is defined between the conductive pads, wherein the void extends through the quartz-crystal plate in a thickness direction. This embodiment can further comprise a respective protrusion situated at each conductive pad. The protrusion separates the short-edge side of the quartz-crystal plate and the respective excitation electrode, wherein the shortest distance between the surface facing the short-edge direction of the protrusion and an edge of the excitation electrode in the long-edge direction desirably is in the range of 10% to 15% the length of the long-edge of the quartz-crystal plate.

In the various embodiments within the scope of this disclosure, the CI value is reduced by adjusting the shortest distance between the edge portion of the electrically conductive adhesive and the edge portion of the excitation electrode.

BRIEF DESCRIPTION OF THE DRAWINGS

FIG. 1A is an exploded perspective view of a first embodiment of a quartz-crystal device.

FIG. 2B is a plan view of the package of FIG. 2A with a quartz-crystal plate mounted therein.

FIG. 3A indicates the bonding condition 150a.

FIG. 5A is a plan view of the package with the quartz-crystal plate 130 mounted to it.

FIG. 7A is a perspective view of yet another embodiment of a quartz-crystal plate.

DETAILED DESCRIPTION

Figure 1B:
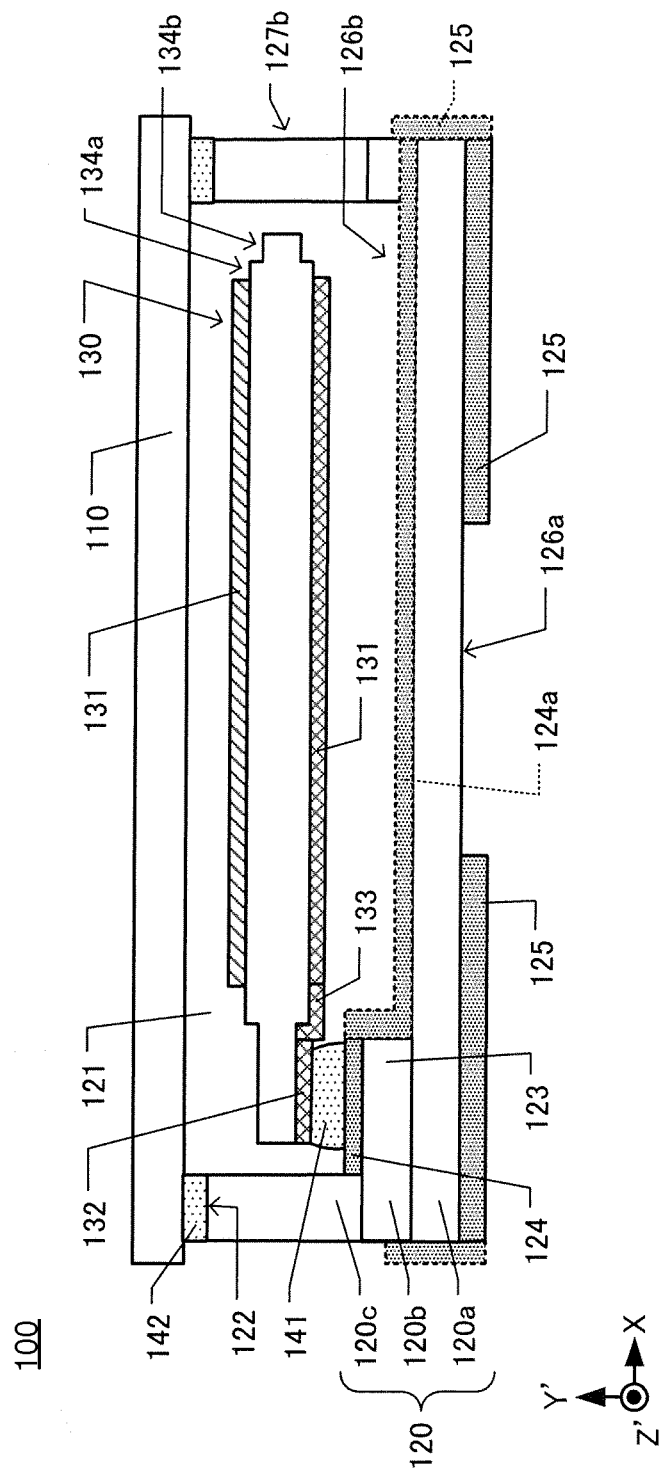
FIG. 1B is an elevational section of the first embodiment.

Various representative embodiments are described below with reference to the respective drawings. It will be understood that the scope of the disclosure is not limited to the described embodiments, unless otherwise stated.

First Embodiment

FIG. 1A is an exploded perspective view of a quartz-crystal device 100 according to this embodiment. The quartz-crystal device 100 comprises a quartz-crystal plate 130, a lid 110, and a package 120. The quartz-crystal plate 130 is fabricated of, for example, AT-cut quartz-crystal plate. An AT-cut quartz-crystal plate has a principal surface (in the Y-Z plane) that is tilted 35° 15' about the Y-axis of the crystal coordinate system (XYZ), in the direction of the Y-axis, from the Z-axis around the X-axis. Thus, in the embodiments below, new axes tilted with respect to the axial directions of the quartz-crystal plate are denoted as the Y'-axis and Z'-axis, respectively. Therefore, in the following embodiments, the longitudinal direction of the quartz-crystal device 100 is referred as the X-axis direction, the height direction of the vibrating device is referred as the Y'-axis direction, and the direction normal to the X-axis and Y'-axis directions is referred as the Z'-axis direction, respectively.

The quartz-crystal plate 130 is mounted in a recess 121 that begins at the +Y'-surface of the package 120. The lid 110 is bonded onto the +Y'-surface of the package 120 so as to hermetically seal the recess 121 in which the quartz-crystal plate 130 is mounted, thereby forming the quartz-crystal device 100.

The quartz-crystal plate 130 is a mesa-type quartz-crystal plate, in which a vibrating portion 134a is thicker (in the Y-axis direction) than a peripheral portion 134b. A respective excitation electrode 131 is situated on each surface (+Y'-surface and –Y'-surface) of the vibrating portion 134a. Also a pair of conductive pads 132 extends in the –X-axis direction to the short edge (–X-edge) of the quartz-crystal plate 130. The excitation electrode 131 on the +Y'-surface is electrically connected via an extraction electrode 133 to the conductive pad 132 located at the (+Z', –X) corner of the –Y'-surface of the quartz-crystal plate 130. Similarly, the excitation electrode 131 on the –Y'-surface is electrically connected via an extraction electrode 133 to the conductive pad 132 located at the (–Z', –X) corner of the –Y'-surface of the quartz-crystal plate 130. The conductive pad 132 at the (–Z', –X) corner can (but need not) contact the –X short-edge and/or the –Z' long-edge of the quartz-crystal plate 130. The conductive pad 132 at the (+Z', –X) corner connects to the +Z' short-edge and/or the –X long-edge. The electrodes formed on the quartz-crystal plate 130, namely the excitation electrodes 131, the conductive pads 132, and the extraction electrodes 133 all are all made of a foundation layer of chromium (Cr) and an overlying layer of gold (Au).

The quartz-crystal device 100 is a surface-mountable quartz-crystal device. It can be surface-mounted by bonding mounting terminals 125 thereof to respective pads on a printed substrate using solder. For surface mounting, the –Y'-surface of the package 120 includes a mounting surface 126a on which are a pair of mounting terminals 125 (see FIG. 1B). The package 120 has a rectangular profile, and includes corner castellations 127a located on the four corners thereof. An edge castellation 127b is centrally located on each short-edge. On each castellation 127b, a part of the mounting terminal 125 is formed.

The recess 121 is defined on the +Y'-surface of the package base 120. On a lower main surface 126b of the recess 121 (opposite the mounting surface 126a) are respective mounting portions 123 used for mounting the quartz-crystal plate 130. A respective connecting electrode 124 is formed on the +Y'-surface of each mounting portion 123. A bonding surface 122 extends around the periphery of the recess 121 and is used for bonding the package 120 and lid 110 together. The connecting electrodes 124 are connected to respective mounting terminals 125. The package 120 is fabricated of a ceramic, for example, and comprises three layers. The first layer 120a is planar and is situated on the –Y'-surface of the package 120. The –Y'-surface of the first layer 120a also serves as a mounting surface 126a, on which the mounting terminals 125 are formed. The +Y'-surface of the first layer 120a is bonded to the second layer 120b. The second layer 120b defines a central void, which is a portion of the recess 121. The mounting portions 123 extend into the recess 121 defined by the second layer 120b. Respective connecting terminals 124 are formed on the +Y'-surfaces of the mounting portions 123. A third layer 120c of the package is bonded to the +Y'-surface of the second layer 120b. The third layer 120c also defines a central void, which is a portion of the recess 121. On the +Y'-surface of the third layer 120c is the bonding surface 122. The electrodes on the package 120, such as the connecting terminals 124 and mounting terminals 125, are each fabricated of a foundation layer of ceramic with an overlying layer of tungsten. Alternatively, a layer of nickel can be used as a foundation layer with an overlying layer of gold.

The lid 110 is a planar plate that hermetically isolates the recess 121 by being bonded to the bonding surface 122 using a sealing material 142 (see FIG. 1B). FIG. 1B is an elevational section of the quartz-crystal device 100 along the line A-A in FIG. 2B, described below. As can be seen, the mounting portions 123 are situated along the −X-side of the recess 121. The connecting electrodes 124 are situated on the +Y'-surfaces of the respective mounting portions 123. The quartz-crystal plate 130 is mounted on the mounting portions 123, and the conductive pads 132 and connecting terminals 124 are electrically connected together using electrically conductive adhesive 141. The mounting terminals 125 extend outward from their respective castellations 127b and the mounting surface 126a of the package 120. Each connecting terminal 124 is electrically connected to a respective mounting terminal 125 via a respective connecting electrode 124a situated on the lower main surface 126b of the package 120.

Figure 2A:
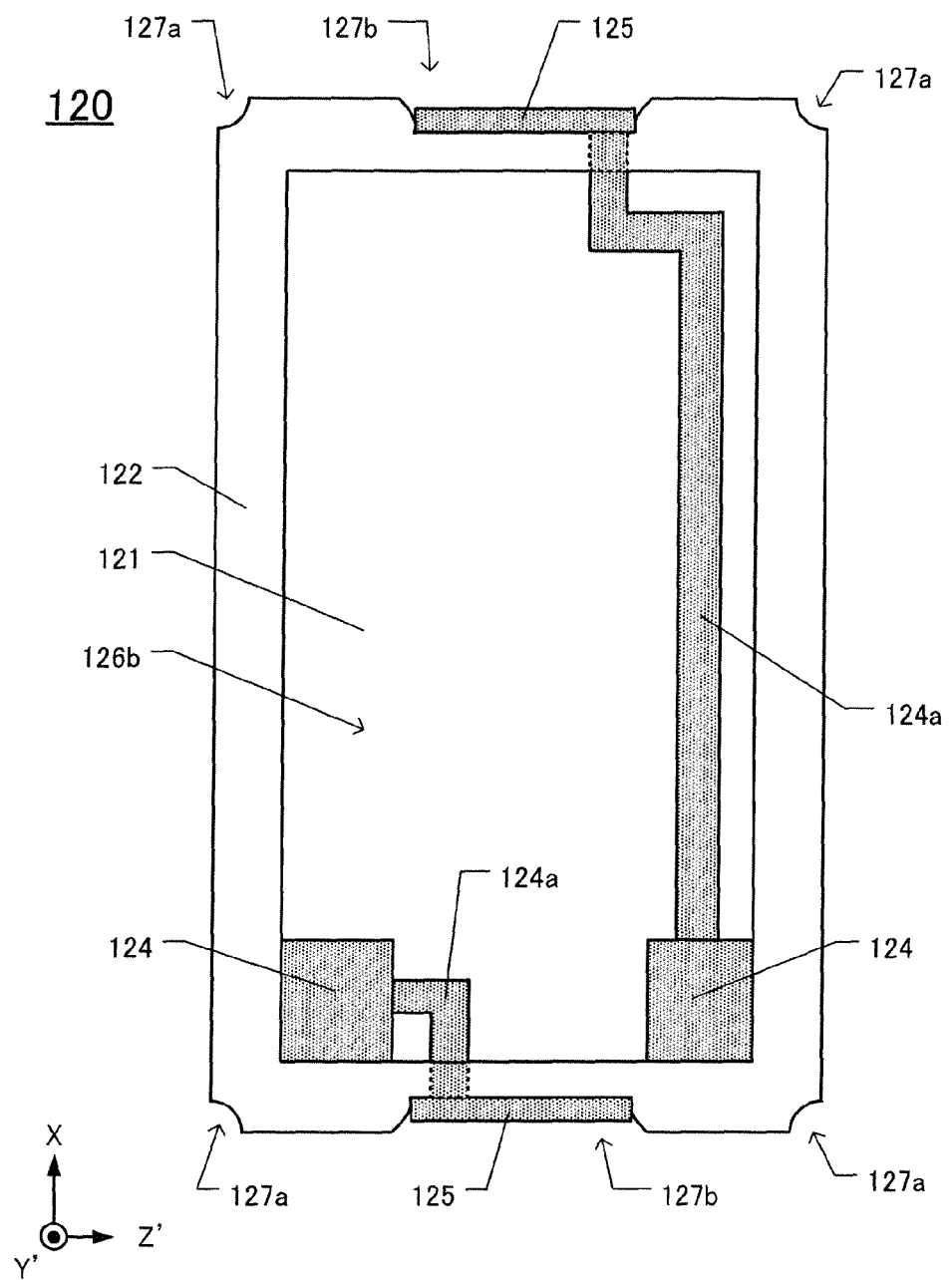
FIG. 2A is a plan view of the package of the first embodiment.

FIG. 2A is a plan view of the package 120, showing the recess 121. The mounting surface 126a (see FIG. 1B) on which the mounting terminals 125 (see FIG. 1B) are formed is on the −Y'-surface of the package 120. In the recess 121, the lower main surface 126b opposes the mounting surface 126a. Respective mounting portions 123 are situated at the (−Z', −X) and (+Z', −X) corners of the lower main surface 126b (see FIG. 1B). Respective connecting electrodes 124 are formed on the +Y'-surface of each mounting portion 123. From these connecting electrodes, respective connecting electrodes 124a extend along the +Z'-side and −Z'-side of the recess 121. The connecting electrodes 124a extend on the lower main surface 126b to, and are electrically connected to, respective mounting terminals 125. On the package 120, the castellations 127 include corner castellations 127a and edge castellations 127b, the latter being situated in the middle of respective short sides.

Multiple packages 120 can be formed from a ceramic sheet that is cut into separate pieces. The castellations 127a prevent package damage during this cutting. The edge castellations 127b are formed to be respective parts of the package 120. The quartz-crystal device 100 is typically mounted to a printed substrate using solder, which adheres to the mounting terminals 125. After soldering, the condition of the solder adhering to the mounting terminals can be visually observed.

FIG. 2B is a plan view of the package 120 with the quartz-crystal plate 130 bonded to it. The quartz-crystal plate 130 is mounted to the connecting electrodes 124 of the package 120 using an electrically conductive adhesive 141. The quartz-crystal plate 130 has a rectangular profile with opposing long edges and short edges. The long-edges are parallel to the X-axis direction and the short edges are parallel to the Z'-axis direction. An exemplary length Si of the short edge is 0. 7 mm, and an exemplary length L1 of the long edge is 1. 0 mm. An exemplary length S2 of the excitation electrode 131 in the short-edge direction is 0. 5 mm, and an exemplary length L2 of the excitation electrode 131 in the long-edge direction is 0. 7 mm. The length S3 of the conductive pad 132 in the short-edge direction (Z'-axis direction) is 0. 3 mm, and the length L3 in the long-edge direction (X-axis direction) is 0. 15 mm.

When bonding the quartz-crystal plate 130 using electrically conductive adhesive 141, certain conditions of bonding, such as position and size of the bonding surface of the adhesive, greatly affect the CI value of the quartz-crystal plate 130 exhibited after bonding. Below, the relationship of CI to various bonding conditions of the electrically conductive adhesive 141 on the quartz-crystal plate 130 is described. FIGS. 3A-3F depict these bonding conditions 150a-150f, wherein the quartz-crystal plate 130, the conductive pads 132, and the electrically conductive adhesive 141 are viewed from the −Y'-direction.

Figure 3A:
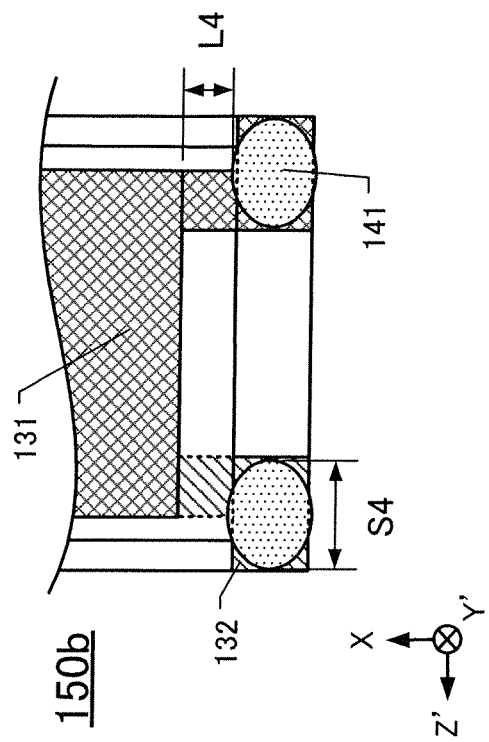

FIG. 3A shows the bonding condition 150a, in which the bonding surfaces of electrically conductive adhesive 141 are relatively large, but the units of adhesive are displaced on the conductive pads 132 in the −X-direction. For each unit of adhesive 141, the shortest distance (in the long-edge, or X-direction) between the nearest edge of the electrically conductive adhesive 141 and the nearest edge of the excitation electrode 131 is denoted L4. Also, the width of the bonding region in the short-edge direction is denoted S4. Note that the bonding conditions 150a-150c involve larger bonding regions than the bonding conditions 150d-150f.

Figure 3B:
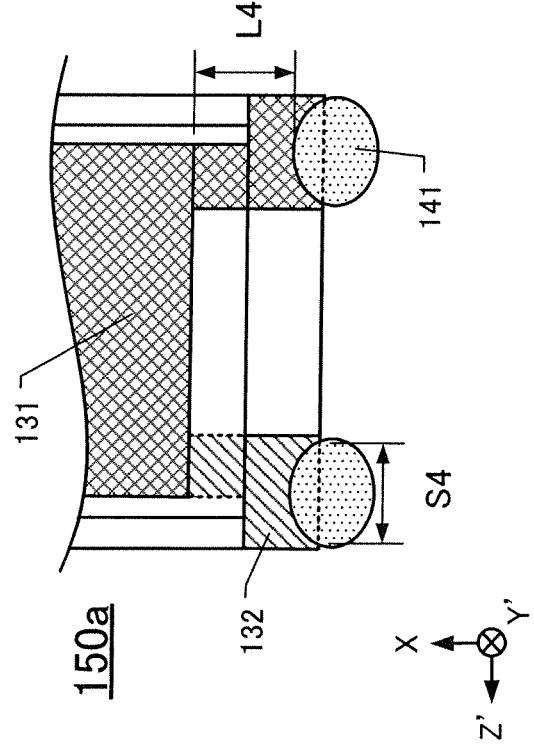
FIG. 3B indicates the bonding condition 150b.

FIG. 3B shows the bonding condition 150b, in which the bonding surfaces of electrically conductive adhesive 141 are relatively large, and the units of adhesive are located substantially in the centers of the respective conductive pads 132. Consequently, although the distance L4 in bonding condition 150b is less than the distance L4 in the bonding condition 150a, the width S4 in the bonding condition 150b is substantially equal to the width S4 in the bonding condition 150a.

Figure 3C:
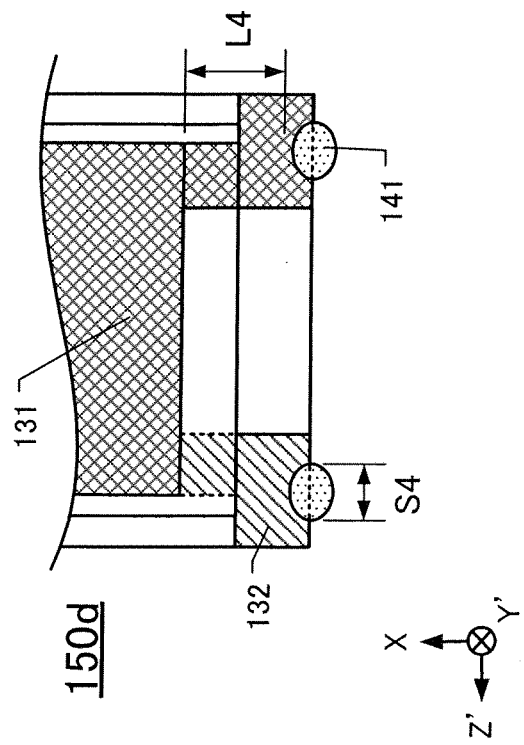
FIG. 3C indicates the bonding condition 150c.

FIG. 3C shows the bonding condition 150c, in which the bonding surfaces of electrically conductive adhesive 141 are relatively large, but the units of adhesive are displaced on the conductive pads 132 in the +X-direction. Consequently, although the distance L4 in the bonding condition 150c is less than the distance L4 in the bonding conditions 150a and 150b, the width S4 in the bonding condition 150c is substantially equal to the width S4 in the bonding conditions 150a and 150b.

Figure 3D:
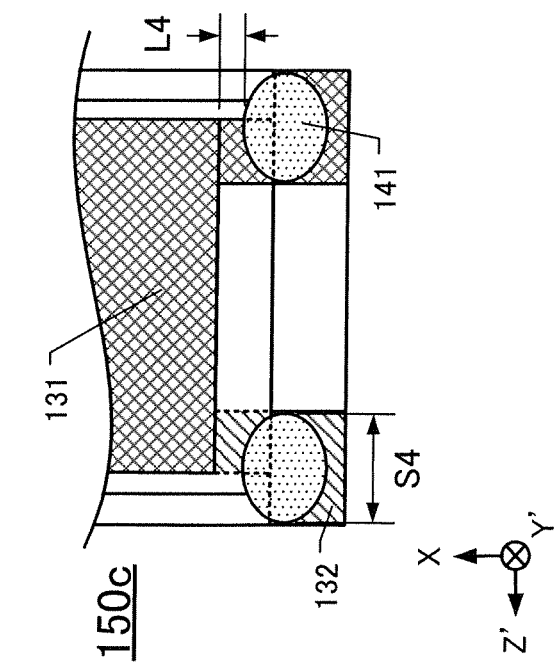
FIG. 3D indicates the bonding condition 150d.

FIG. 3D shows the bonding condition 150d, in which the bonding surfaces of electrically conductive adhesive 141 are relatively small, and are displaced on the conductive pads 132 in the −X-axis direction. Consequently, although the distance S4 in bonding condition 150d is less than in the bonding conditions 150a-150c, the distance L4 is relatively large.

Figure 3E:
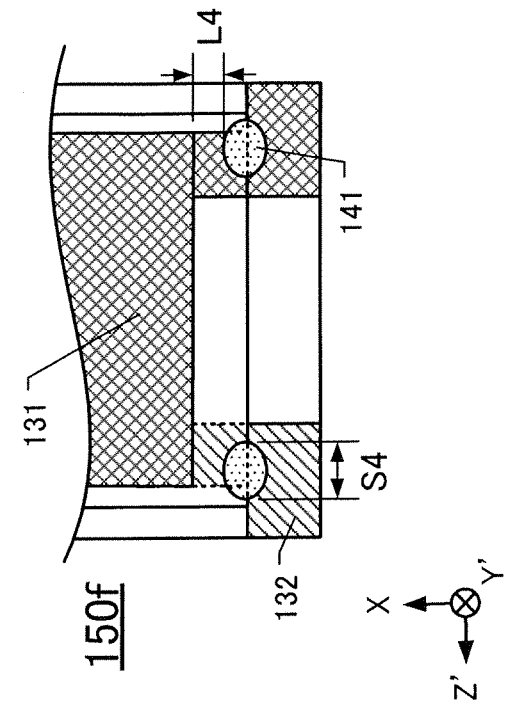
FIG. 3E indicates the bonding condition 150e.

FIG. 3E shows the bonding condition 150e, in which the bonding surfaces of electrically conductive adhesive 141 are relatively small, but the units of adhesive are located substantially in the centers of the respective conductive pads 132. Consequently, the distance L4 in bonding condition 150e is less than in the bonding condition 150d, and the length S4 in bonding condition 150e is less than in the bonding condition 150d.

Figure 3F:
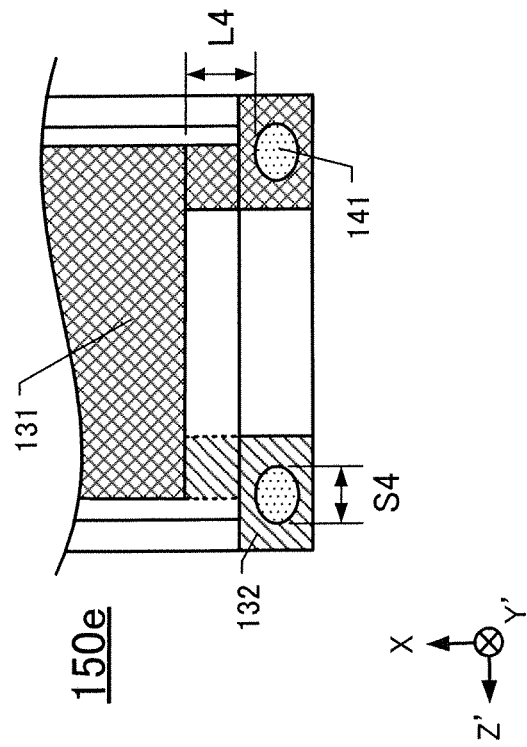
FIG. 3F indicates the bonding condition 150f.

FIG. 3F shows the bonding condition 150f, in which the bonding surfaces of electrically conductive adhesive 141 are relatively small, and are displaced on the conductive pads 132 in the +X-axis direction. Consequently, although the distance L4 in bonding condition 150f is less than in the bonding conditions 150d and 150e, the length S4 in bonding condition 150f is less than in the bonding conditions 150d and 150e.

Figure 4A:
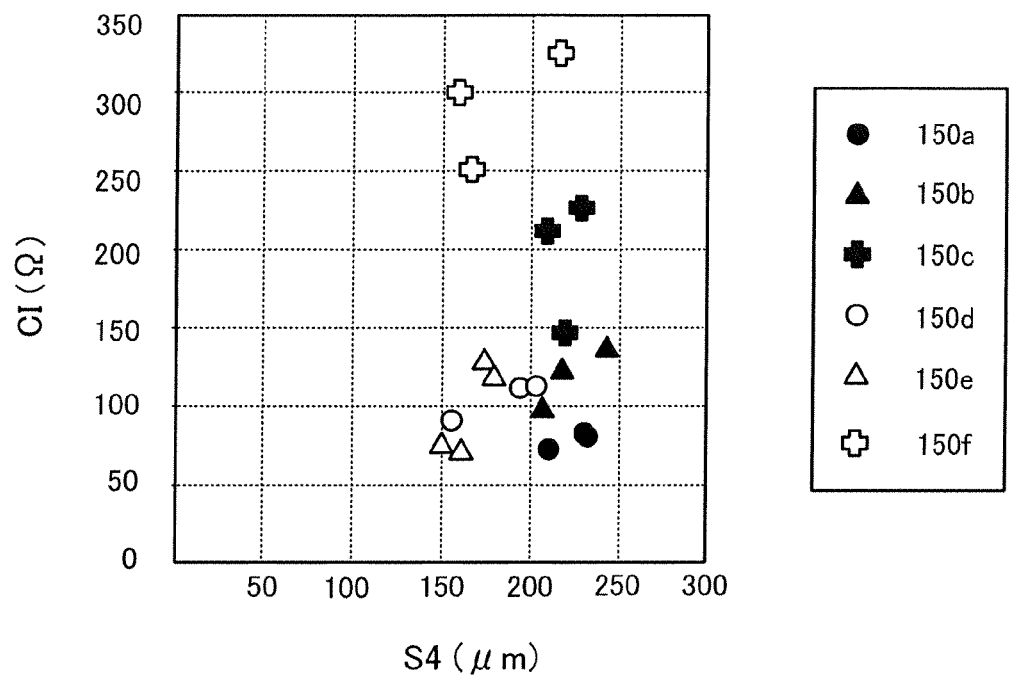
FIG. 4A is a graph of CI versus length S4 (distance between the respective electrically conductive adhesive used in the quartz-crystal device and the respective conductive pad 132 in the short-edge direction (Z'-axis direction)).

FIG. 4A is a graph showing the relationship between the length S4 (distance between the unit of electrically conductive adhesive 141 and the conductive pad 132 in the short-edge direction (Z'-axis direction)) and CI. Each symbol in FIG. 4A corresponds to a respective bonding condition. The black circles denote bonding condition 150a, the black triangles denote bonding condition 150b, the black crosses denote bonding condition 150c, the white circles denote bonding condition 150d, the white triangles denote bonding condition 150e, and the white crosses denote bonding condition 150f. For each bonding condition, three to four quartz-crystal devices 100 were fabricated, and the respective CI values exhibited by the devices were measured. Note that the white symbols correspond to respective bonding conditions 150d-150f having shorter lengths S4, and the black symbols correspond to respective bonding conditions 150a-150c having greater lengths S4. In FIG. 4A, the length S4 of the white-symbol devices ranges from 300 μm to 400 μm, and the length S4 of the black-symbol devices ranges from 400 μm to 500 μm. No correlation of CI with length S4 was found in any of the white-symbol devices. Therefore, the length S4 and the CI do not appear to be related.

Figure 4B:
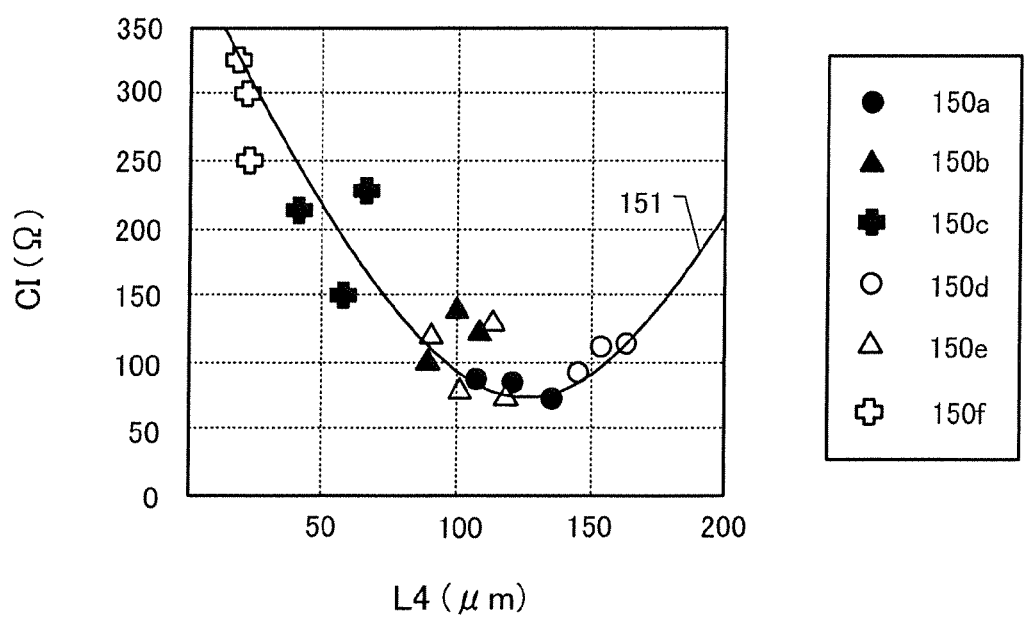
FIG. 4B is a graph of CI versus length L4 (distance between the edge portions of the respective electrically conductive adhesive used in the quartz-crystal device and the edge portions of the excitation electrodes in the long-edge direction (X-axis direction)).

FIG. 4B is a graph showing the relationship between the length L4 (distance between the unit of electrically conductive adhesive 141 and the edge of the excitation electrode 131 in the long-edge direction (X-axis direction)) and CI. In FIG. 4B the bonding conditions 150a-150f have similar symbols as in FIG. 4A. In FIG. 4b, the bonding conditions 150a-150f produce respective data that are distributed along a quadratic curve. Thus, there appears to be a relationship between the distance L4 and CI. As the distance between the excitation electrodes 131 and the units of electrically conductive adhesive 141 becomes closer, the electrically conductive adhesive 141 appears to dampen vibrations produced by the vibrating portion 134a, thereby increasing CI values. Also, as the distance between the excitation electrode 131 and the units of electrically conductive adhesive 141 increases, the vibrating portion 134a becomes increasingly unstable, which increases CI. According to the data in FIG. 4B, the distance L4 desirably is 100 μto 150 μm, in which CI is less than 100Ω.

A predetermined vibration of the quartz-crystal plate 130 is produced by the excitation electrodes 131. Consequently, the size of the excitation electrodes 131 affects the vibration of the quartz-crystal plate 130. The distance L4 also affects vibration of the quartz-crystal plate 130. Therefore, the length L2 of the excitation electrode 131 and the distance L4 are correlated. Since the distance L4 desirably ranges from 100 μm to 150 μm when the length L2 of the excitation electrode 131 in the long-edge direction is 0.7 mm, the relationship of L2 to L4 desirably is in the range of approximately 14% to 22%. Also, each excitation electrode 131 is sized according to a specific ratio relative to the dimension of the outer edge of the quartz-crystal plate 130. Specifically, the distance L2 desirably is in the range of 10% to 15% of the distance L1. The relationship of L4 and L1 is applicable to both mesa-type quartz-crystal plates and planar quartz-crystal plates.

Second Embodiment

The quartz-crystal plate can be bonded, using electrically conductive adhesive, at multiple bonding regions. In this embodiment a quartz-crystal device 200 is described in which the quartz-crystal plate is bonded using units of electrically conductive adhesive at a plurality of bonding regions. In the following description, components that are similar to corresponding components in the first embodiment have the same respective reference numerals and are not described further below.

Regarding the quartz-crystal device 200 of this embodiment, FIG. 5A is a plan view of the package 120 with the quartz-crystal plate 130 mounted in it. In FIG. 5A, the quartz-crystal device 200 is formed by bonding a lid 110 (see FIG. 1A) onto the +Y'-surface of the package 120. The quartz-crystal device 200 differs from the first embodiment 100 in that, in the second embodiment, each conductive pad 132 of the quartz-crystal plate 130 is mounted using four units of electrically conductive adhesive 141.

Figure 5B:
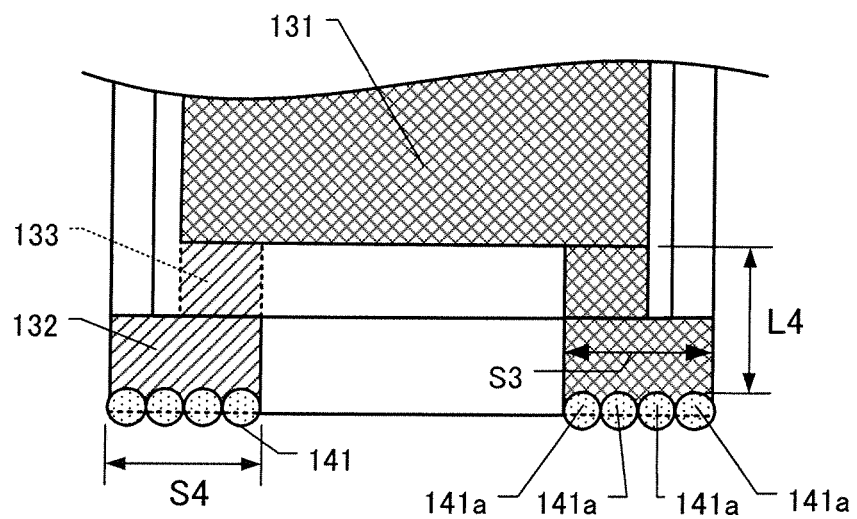
FIG. 5B is a plan view of a portion of the quartz-crystal plate on which conductive pads and electrically conductive adhesive have been formed, as viewed from the –Y'-axis direction.
Figure 5B:
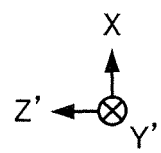

FIG. 5B is a plan view of the quartz-crystal plate 130, the conductive pads 132, and the units of electrically conductive adhesive 141, as viewed from the −Y'-axis direction. The units of electrically conductive adhesive 141 are strung out in the Z'-axis direction on respective conductive pads 132. Four units of electrically conductive adhesive are situated on each conductive pad 132, thereby providing four bonding regions 141a per conductive pad. Thus, the bonding regions 141a conductively contact the respective conductive pads 132. In FIG. 5B, the units of electrically conductive adhesive 141 are arranged so that the shortest distance L4 between the edges of the units and the closest edge of the excitation electrode 131 (in the X-axis direction) is approximately in the range of 10% to 15% of the length L1 of the quartz-crystal plate 130 in the long-edge direction. The units of electrically conductive adhesive 141 are also arranged so that their total strung-out length S4 (in the Z'-axis direction) on each conductive pad 132 is equal to the width S3 of the conductive pad 132 in the short-edge direction.

In this embodiment, by forming multiple bonding regions 141a on each conductive pad 132, the length S4 and the distance L4 can be adjusted separately without difficulty. Since FIG. 4A shows that the length S4 does not affect CI, S4 can be relatively large, which allows the bonding region to be formed relatively wide. By providing a large-area bonding region, the bonding strength of the electrically conductive adhesive 141 to the quartz-crystal plate 130 is increased, which increases the impact resistance of the quartz-crystal device 200.

Third Embodiment

In the quartz-crystal plate, a step can be formed, by which the excitation electrodes protrude in the −Y'-axis direction from the principal surface of the plate. The conductive pad can be formed on the step. This embodiment of a quartz-crystal device 300 includes a quartz-crystal plate 330 having such a step.

Figure 6A:
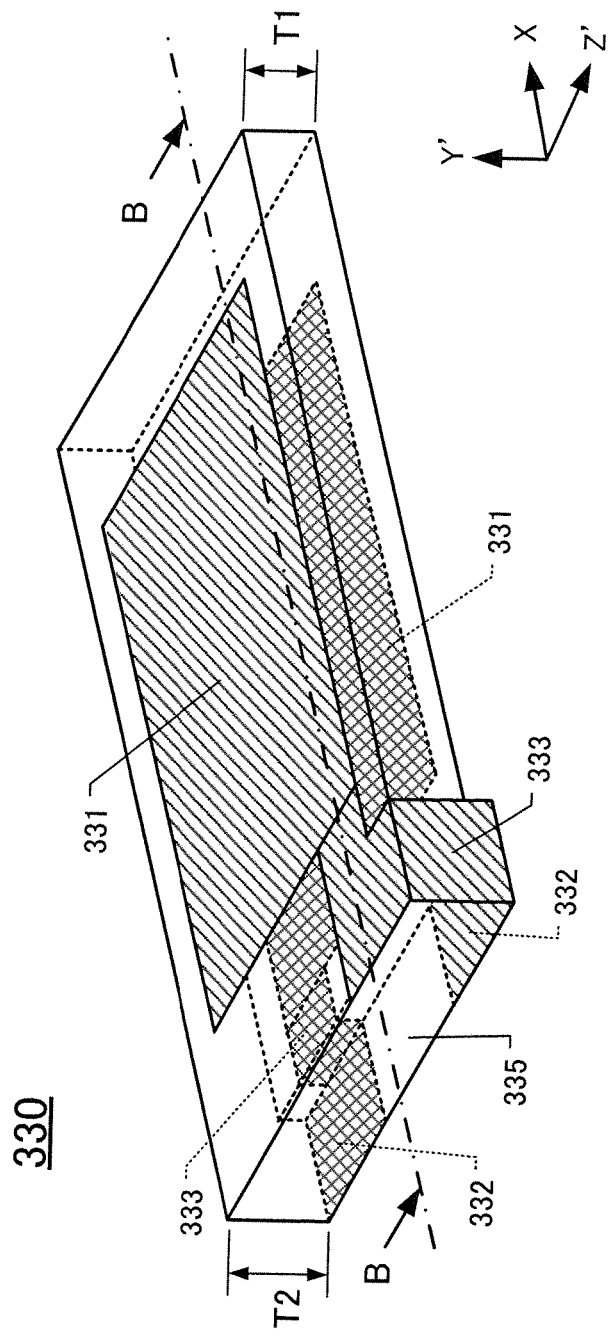
FIG. 6A is an exploded perspective view of another embodiment of a quartz-crystal plate.

FIG. 6A is an exploded perspective view of the quartz-crystal plate 330 of this embodiment. The quartz-crystal plate 330 comprises respective excitation electrodes 331 formed on both principal surfaces (+Y'-surface and −Y'-surface) thereof. Along the −X-edge on the −Y'-surface, respective conductive pads 332 are situated on the +Z'-end and −Z'-end. The conductive pads 332 are situated on the step 335 that protrudes in the −Y'-direction. Thus, the conductive pads 332 are close, in the Y-axis direction, to the excitation electrodes 331. The Y'-thickness T2 of the step 335 is greater than the thickness T1 in the vicinity of the excitation electrodes 331. A respective extraction electrode 333 connects the excitation electrode 331 on the +Y'-surface to the conductive pad 332 on the +Z'-end; similarly, a respective extraction electrode 333 connects the excitation electrode 331 on the −Y'-surface to the conductive pad 332 on the −Z'-end.

Figure 6B:
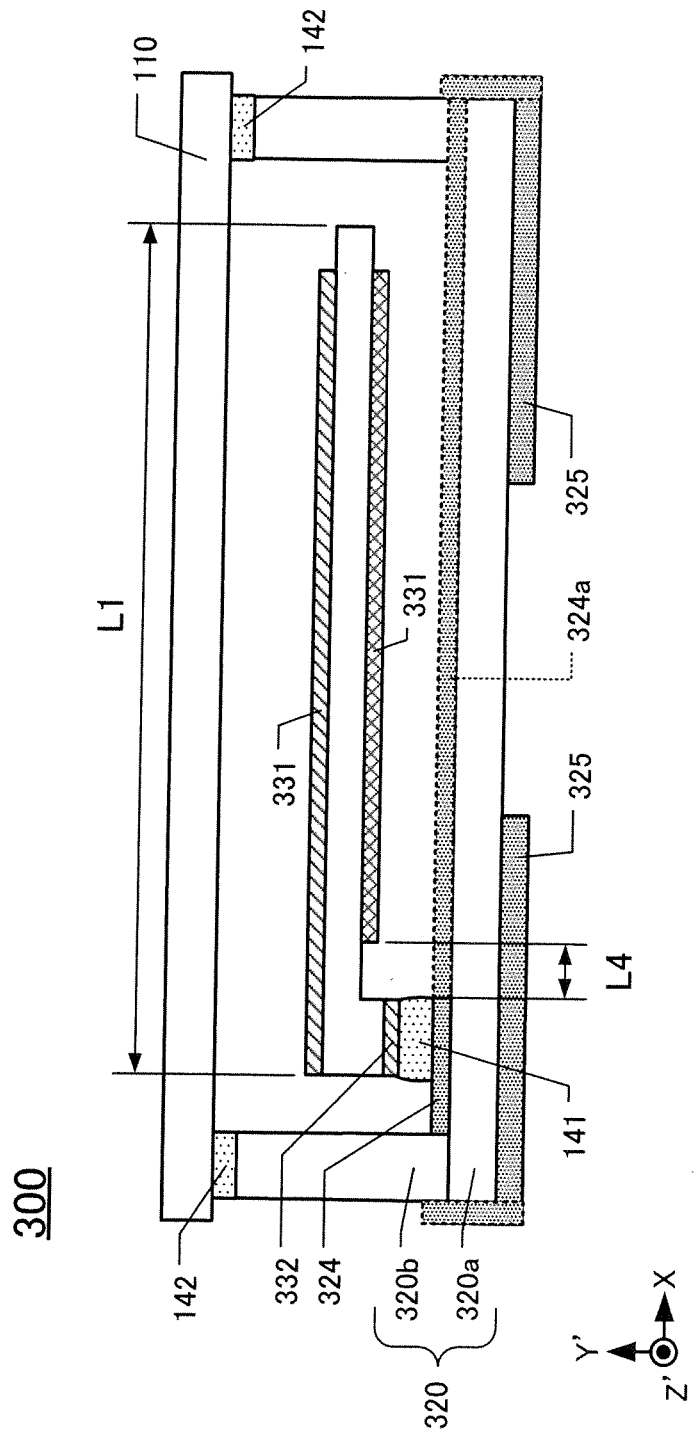
FIG. 6B is an elevational section of the quartz-crystal device of FIG. 6A.

FIG. 6B is a cross-sectional view of the quartz-crystal device 300 of this embodiment, along the line B-B in FIG. 6A. The quartz-crystal device 300 comprises a quartz-crystal plate 330, a lid 110, and a package 320. The package 320 comprises a first layer 320a on the −Y'-surface of the package and a second layer 320b situated on the +Y'-surface of the first layer 320a. Respective mounting terminals 325 are situated on the −Y'-surface on the first layer 320a. The lid 110 is bonded to the +Y'-surface of the second layer 320b using a sealing material 142. Mounting terminals 325 are situated on the −Y'-surface of the package 320. Respective connecting terminals 324 are situated on the +Y'-surface of the first layer 320a and are electrically connected together using the electrically conductive adhesive 141. Also, respective connecting terminals 324 and mounting terminals 325 are electrically connected together by respective connecting electrodes 324a. In the long-edge direction (X-axis direction), the shortest distance L4 between the edge of the excitation electrode 331 to the electrically conductive adhesive 141 is in the range of approximately 10% to 15% the length L1 of the quartz-crystal plate 330 in the long-edge direction.

Since the conductive pads 332 are situated on the step 335, the distance L4 between the unit of electrically conductive adhesive 141 and the excitation electrode 331 is prevented from being decreased by application of excessive electrically conductive adhesive 141. Also, by specifying the distance between the conductive pad 332 and the excitation electrode 331 as the distance L4, the distance L4 can be easily adjusted. In the package 320 a mounting portion is not necessary due to use of the step 335.

Fourth Embodiment

In the quartz-crystal device 300 of the third embodiment, a step can be located on either the +X-edge or −X'-edge of the quartz-crystal plate. In this fourth embodiment, the quartz-crystal device 400 has steps on both the +X-edge and the −X-edge.

A quartz-crystal plate 430 according to this embodiment is shown in FIG. 7A. Respective excitation electrodes 431 are formed on both principal surfaces (+Y'-surface and −Y'-surface) of the quartz-crystal plate 430. Respective conductive pads 432 are situated on the −Y'-surface of the quartz-crystal plate 430 along the +X-edge and the −X-edge thereof. The excitation electrode 431 on the +Y'-surface is connected electrically to the conductive pad 432 situated along the −X-edge. Similarly, the excitation electrode 431 on the −Y'-surface is connected electrically to the conductive pad 432 situated along the +X-edge. These electrical connections are made via respective extraction electrodes 433. Respective steps 435 extend along each of the +X-edge and −X-edge of the quartz-crystal plate 430. The steps 435 protrude in the −Y'-direction from the excitation electrode 431 situated on the −Y'-surface of the quartz-crystal plate 430. The conductive pads 432 are situated on the −Y'-surface of the steps 435.

Figure 7B:
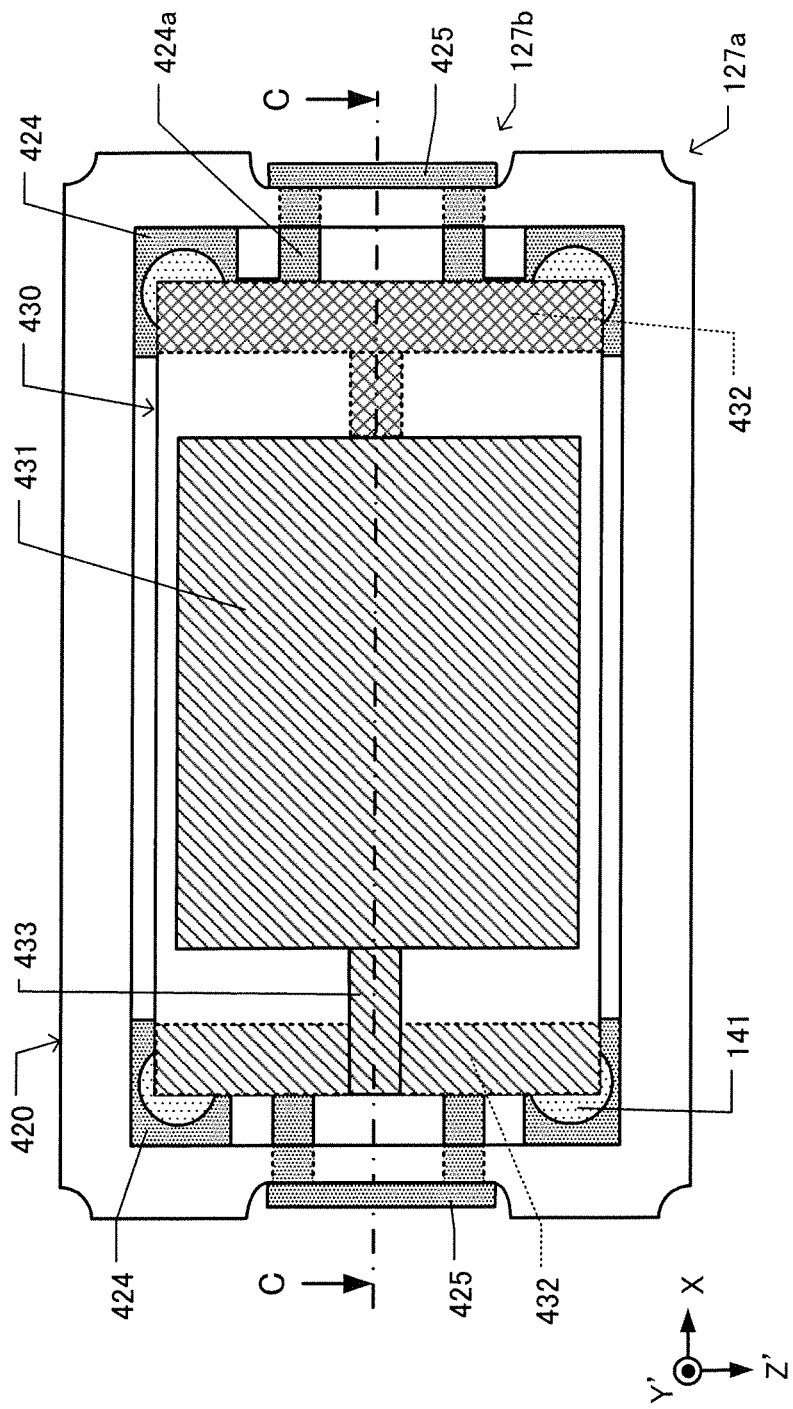
FIG. 7B is a plan view of the package of FIG. 7A, with a quartz-crystal plate mounted to it.

FIG. 7B is a plan view of the package 420 with the quartz-crystal plate 430 mounted to it. The package 420 defines a recess 421 on the +Y'-surface thereof. Respective mounting terminals 425 (see FIG. 7C) are situated on the mounting surface 126a (−Y'-surface of the package) and extending onto the +X-side and −X-side surfaces of the package 420. Respective connecting electrodes 424 are situated on each corner of the lower main surface 126b (surface opposite the mounting surface 126a; see FIG. 7C) inside the recess 421. The connecting electrodes 424 on the −X-side are connected to the respective mounting terminals 425 on the −X-side, and the connecting electrodes 424 on the +X-side are connected to the respective mounting terminals 425 on the +X-side. When the quartz-crystal plate 430 is mounted in the recess, each corner of the quartz-crystal plate 430 is bonded to the respective conductive pads 432 using electrically conductive adhesive 141.

Figure 7C:
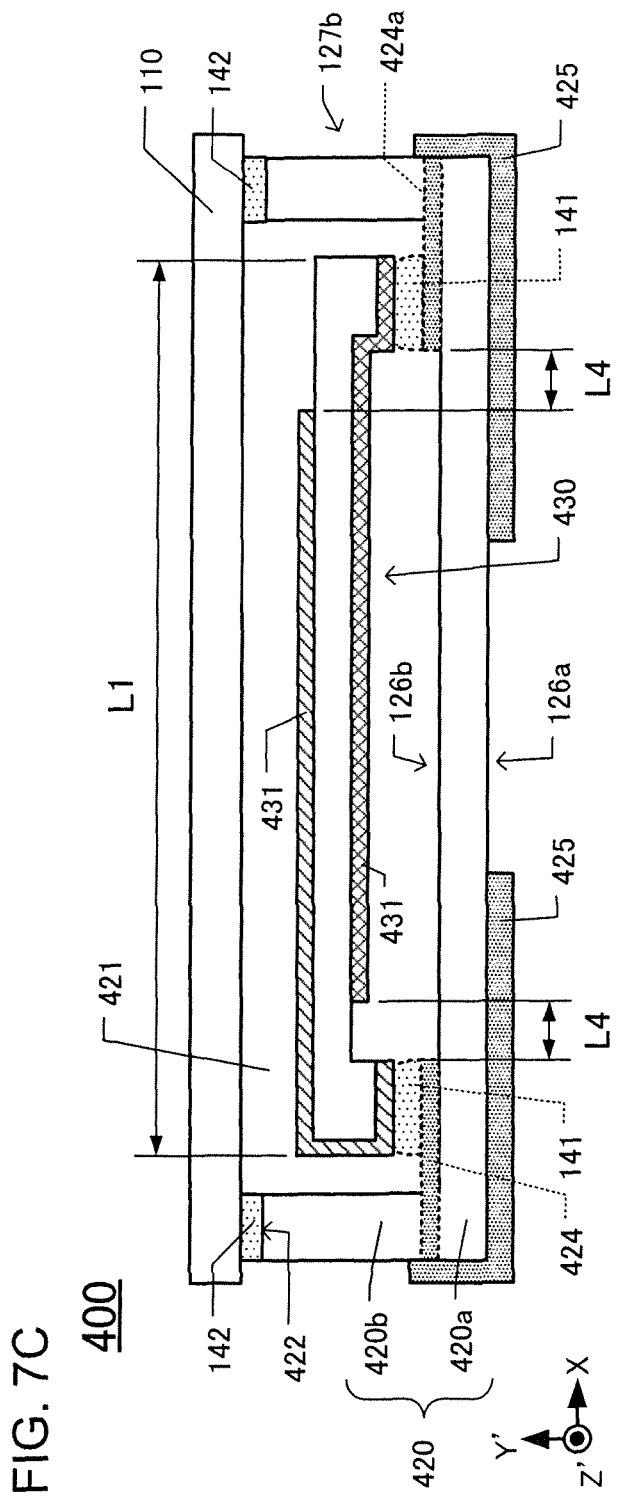
FIG. 7C is an elevational section of an embodiment of a quartz-crystal device.

FIG. 7C is a cross-sectional view of the quartz-crystal device 400, along the line C-C in FIG. 7B. The package 420 comprises a first layer 420a, which includes a mounting surface 126a on the −Y'-surface and a lower main surface 126b on the +Y'-surface of the package. The package includes a second layer 420b situated on the +Y'-surface of the first layer 420a; the second layer has a bonding surface 422 on the +Y'-surface thereof. The package 420 is bonded to the lid 110 at the bonding surfaces 422 using sealing material 142. The quartz-crystal plate 430 is mounted in the recess portion 421 using the connecting electrodes 424 and electrically conductive adhesive 141. The respective connecting electrodes 424 and mounting terminals 425 are electrically connected together via respective connecting electrodes 424a. The shortest distance L4 between the edge of the electrically conductive adhesive 141 bonding the quartz-crystal plate 430 and the excitation electrode 431 in the long-edge direction (X-direction) is in the range of approximately 10% to 15% the length of the length L1 of the quartz-crystal plate 430 in the long-edge direction.

By mounting the quartz-crystal plate 430 into the package 420 at the respective steps 435, the distance between the lower main surface 126b and the excitation electrode 431 is increased, which prevents the excitation electrode 431 from contacting the lower main surface 126b. Also, in this embodiment, the quartz-crystal plate 430 is mounted to the package 420 at four locations, which provides stronger impact resistance.

Fifth Embodiment

To prevent electrically conductive adhesive from being bonded directly to the excitation electrodes, a protrusion can be formed on the quartz-crystal plate between the conductive pad and the excitation electrode. This embodiment of a quartz-crystal device 500 includes such a protrusion. In the following description, components that are similar to corresponding components in the first embodiment have the same respective reference numerals and are not described further below.

Figure 8A:
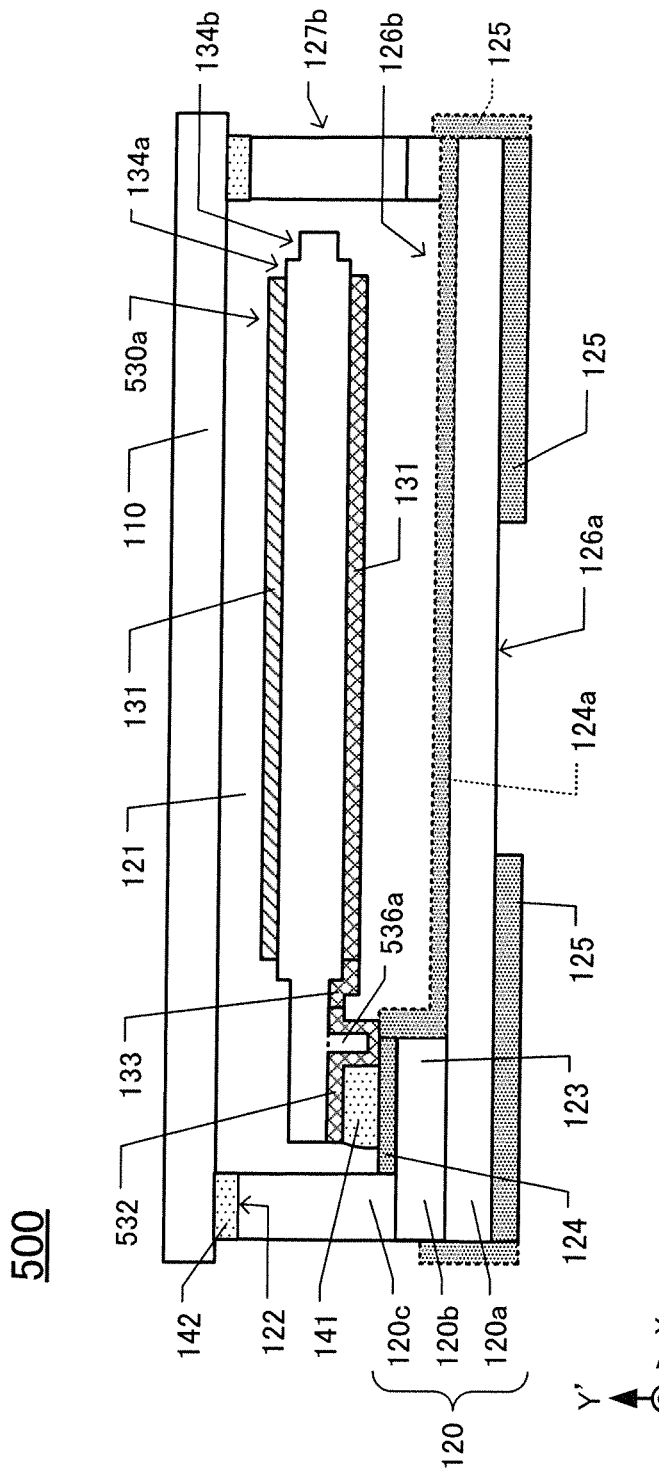
FIG. 8A is an elevational section of yet another embodiment of a quartz-crystal device.

FIG. 8A is a cross-sectional view of the quartz-crystal device 500. FIG. 8A shows a cross-section similar to that of the quartz-crystal device 100 shown in FIG. 1B. The section shown in FIG. 8A is along the line D-D in FIG. 8B. The quartz-crystal device 500 comprises a quartz-crystal plate 530a, a lid 110, and a package 120. The quartz-crystal plate 530a is mesa-shaped and comprises a vibrating portion 134a that vibrates at a predetermined frequency. The thickness of the vibrating portion 134a is greater in central regions than in peripheral regions 134b. Respective excitation electrodes 131 are situated on the +Y'-surface and on the −Y'-surface (principal surfaces) of the vibrating portion 134a. A pair of conductive pads 532 is situated on the −X-edge (short-edge) of the quartz-crystal plate 530a. The conductive pads 532 are electrically connected to respective excitation electrodes 131 via respective extraction electrodes 133. On the quartz-crystal plate 530a where the conductive pads 532 are located, respective protrusions 536a protrude in the −Y'-axis direction. The protrusions 536a prevent electrically conductive adhesive 141 from flowing toward the excitation electrode 131.

Figure 8B:
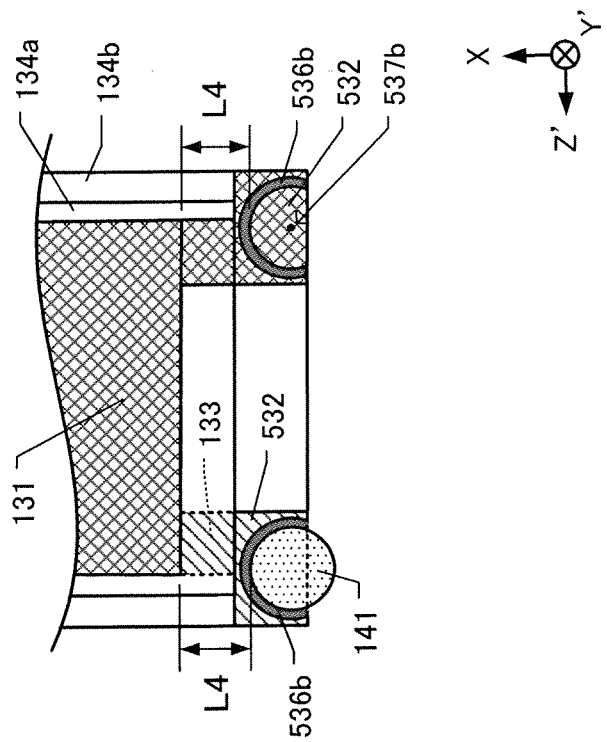
FIG. 8B is an enlarged plan view of the quartz-crystal plate of the embodiment shown in FIG. 8A.

FIG. 8B is an enlarged plan view of a portion of the quartz-crystal plate 530a, specifically the −X-region as viewed from the −Y'-surface. On the +Y'-surface of the quartz-crystal plate 530a is an excitation electrode 131. The excitation electrode 131 on the +Y'-surface of the quartz-crystal plate is electrically connected to a respective conductive pad 532 situated on the (−X, −Z') corner of the quartz-crystal plate 530a via a respective extraction electrode 133. Similarly, the excitation electrode 131 on the −Y-surface of the quartz-crystal plate is electrically connected to a respective conductive pad 532 situated on the (−X, −Z') corner of the quartz-crystal plate 530a via a respective extraction electrode 133. Respective protrusions 536a extending in the −Y'-axis direction on respective regions where the conductive pads 532 are situated on the quartz-crystal plate 530a. In FIG. 8B, a protrusion 536a is shown on the −Z'-side of the conductive pad 532. In the cross-sectional view of the protrusion 536a in the X-Z' plane, the −X-surface (inner surface) of the protrusion 536a forms a portion of a circle. The center 537a of the circle is situated on the −X-side of the protrusion 536a as viewed from the protrusion 536a, opposing the excitation electrode 131. The shortest distance between the inner surface of the protrusion 536a and the excitation electrode 131 in the long-edge direction (X-axis direction) is denoted L4. The conductive pad 532 (see FIG. 8B) on the +Z'-side includes a protrusion 536a and corresponding unit of electrically conductive adhesive 141. The electrically conductive adhesive 141 is applied to the inner surface of the protrusion 536a, and its inner periphery thereby assumes a partial-circle profile. The shortest distance between the edge of the electrically conductive adhesive 141 and the edge of the excitation electrode 131 in the long-edge direction (X-axis direction) is denoted L4.

The distance L4 between the electrically conductive adhesive 141 and the excitation electrode 131 can be established by the protrusion 536a to provide the minimum distance between the inner surface of the protrusion 536a and the excitation electrode 131 in the long-edge direction (X-axis direction). In FIG. 4B, the distance L4 desirably is in the range of 10% to 15% the length to the quartz-crystal plate 530a in the long-edge direction. Although the electrically conductive adhesive 141 is applied to the conductive pad 532 or the connecting electrode 124 of the package 120 while mounting the quartz-crystal plate 530a in the package 120, the X-Z'-plane of the applied electrically conductive adhesive 141 assumes a partial-circular profile, as facilitated by applying the electrically conductive adhesive 141 using a needle having a circular tip. The protrusion 536a, formed to have a partial-circular profile, corresponds to the shape of the applied electrically conductive adhesive 141. This allows uniform bonding between the electrically conductive adhesive 141 and conductive pad 532, which prevents unevenness of the connection of the electrically conductive adhesive 141 to the conductive pad 532.

Figure 8C:
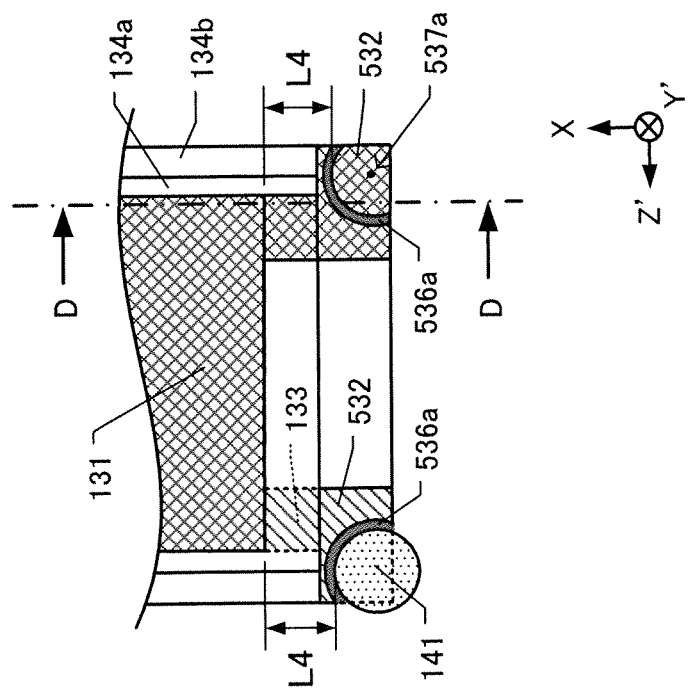
FIG. 8C is another enlarged plan view of the quartz-crystal plate of the embodiment of FIG. 8A.

FIG. 8C is a plan view of an alternative configuration of the quartz-crystal plate 530b, specifically the −X-region thereof, as viewed from the −Y'-axis direction. Compared to the quartz-crystal plate 530a, the quartz-crystal plate 530b has a different configuration of the protrusion 536b. Other aspects are similar to the quartz-crystal plate 530a. In FIG. 8C, the protrusion 536b is on the conductive pad 532. Similar to the protrusion 536a, the protrusion 536b is formed so that the inner surface thereof forms a portion of a circle. The center 537b of the circle is formed on the −X-side of the protrusion 536b, as viewed from the protrusion 536b and opposing the excitation electrode 131. The shortest distance between the inner surface of the protrusion 536b and the excitation electrode 131 in the long-edge direction (X-axis direction) is denoted L4. Compared to the center 537a of the protrusion 536a of the quartz-crystal plate 530a, the center 537b of the protrusion 536b is closer to the inner periphery of the quartz-crystal plate as viewed from the Z'-axis direction. Since the protrusion 536b is situated along the inner surface of the electrically conductive adhesive 141, the outer periphery of the electrically conductive adhesive contacting the protrusion 536b assumes a circular configuration. The shortest distance between the edge of the electrically conductive adhesive 141 and the edge of the excitation electrode 131 in the long-edge direction (X-axis direction) is denoted L4. Since the centers 537b of the protrusions 536b are situated closer to each other in the Z'-axis direction than the centers 537a of the protrusions 536a, the bonding area between the electrically conductive adhesive 141 and the conductive pads 532 is greater than in the quartz-crystal plate 530a.

In the quartz-crystal plate 530b, the bonding area between the electrically conductive adhesive 141 and the conductive pad 432 can be further increased by moving the centers 537b of the protrusions 536b closer together in the Z'-axis direction. Thus, the bonding strength between the electrically conductive adhesive 141 and the conductive pads 532 can be further strengthened and impact-resistance of the quartz-crystal device can be increased. Adjustment of the bonding area between the electrically conductive adhesive 141 and conductive pad 532 can also be accomplished by adjusting the radius of the circle inside the protrusion.

In the quartz-crystal plates 530a and 530b, increases in CI can be prevented by forming the protrusions such that electrically conductive adhesive 141 overflowing the protrusions flows toward the excitation electrode 131. As shown in FIG. 4B, the shortest distance L4 between the electrically conductive adhesive 141 and the excitation electrode 131 in the long-edge direction (X-axis direction) is desirably in the range of 10% to 15% the length of the quartz-crystal plate in the long-edge direction. The quartz-crystal plate including protrusions, as explained in this embodiment, allows adjustments of the position of the centers of the protrusions and of the radii of the circles of the inner surfaces, which allows adjustment of the bonding area between the conductive pads and the electrically conductive adhesive. Thus, manufacturing costs can be reduced by decreasing the amount of electrically conductive adhesive used in manufacture. This embodiment also provides bonding surfaces that increase the shock-resistance of the quartz-crystal device.

Sixth Embodiment

A void extending through the thickness of the quartz-crystal plate can be defined between the pair of conductive pads. This embodiment of a quartz-crystal device 600 includes such a void. In the following description, components that are similar to corresponding components in the first embodiment have the same respective reference numerals and are not described further below.

Figure 9A:
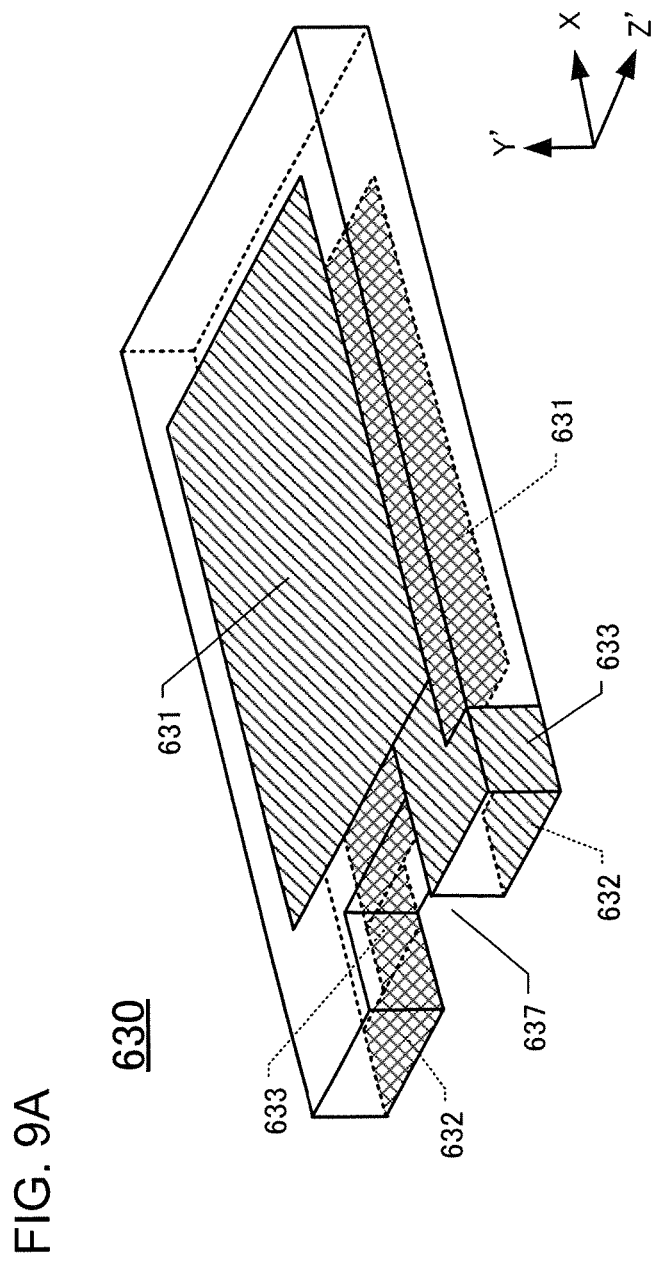
FIG. 9A is a perspective view of yet another embodiment of a quartz-crystal plate.

FIG. 9A is a perspective view of the quartz-crystal plate 630, in which respective excitation electrodes 631 are situated on both principal surfaces (+Y'-surface and −Y'-surface). Respective conductive pads 632 are situated on the −Y'-surface near the (−X, −Z') and (−X, +Z') corners. The excitation electrode 631 situated on the +Y'-surface is connected via a respective extraction electrode to a respective conductive pad 632 situated on the +Z'-side. The excitation electrode 631 situated on the −Y'-surface is connected via a respective extraction electrode to a respective conductive pad 632 situated on the −Z'-side. A void 637 is defined between the conductive pads 632 such that a respective conductive pad is situated on the +Z'-side and −Z'-side of the void. The void 637 extends depthwise through the quartz-crystal plate 630 in the Y'-axis direction.

Figure 9B:
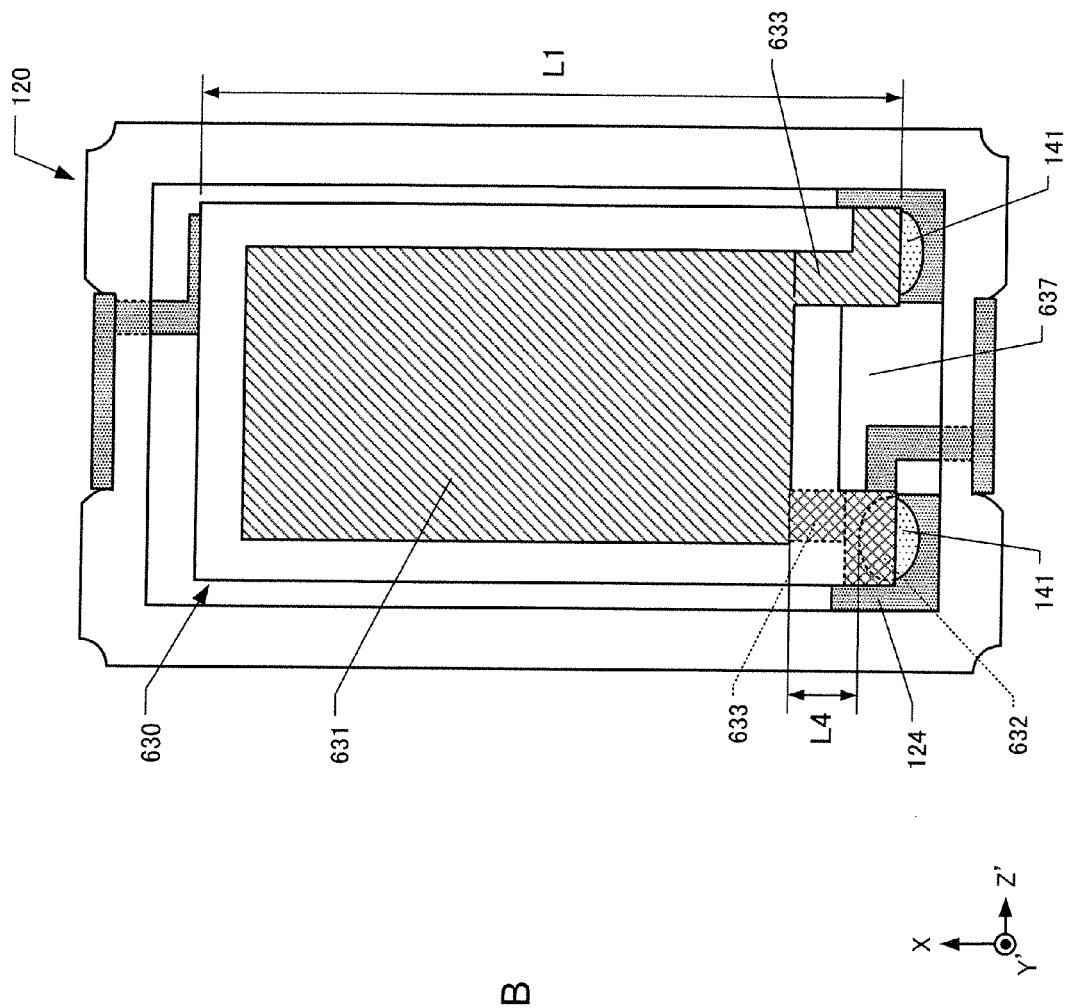
FIG. 9B is a plan view of the package on which the quartz-crystal plate of FIG. 9A is mounted.

FIG. 9B is a plan view of the package 120 in which the quartz-crystal plate 630 is mounted. The quartz-crystal device 600 comprises a quartz-crystal plate 630, a package 120, and a lid 110 (see FIG. 1A). The quartz-crystal device 600 is formed by bonding the lid 110 on the +Y'-surface of the package 120 using a sealing material 142. In FIG. 9B, the shortest distance L4 between the electrically conductive adhesive 141 and the excitation electrode 631 in the long-edge direction (X-axis direction) is 10% to 15% the length L1 of the quartz-crystal plate 630 in the long-edge direction.

As the quartz-crystal device is miniaturized, the quartz-crystal plate becomes correspondingly smaller. As the quartz-crystal plate is miniaturized, the distance between the conductive pads is correspondingly reduced. This can lead to contact between the electrically conductive adhesive 141 bonded onto respective conductive pads. With respect to the quartz-crystal plate 630, contact between units of electrically conductive adhesive situated on respective conductive pad 632 is prevented by the existence of the void 637 between the conductive pads 632. Since the respective units of electrically conductive adhesive 141 on the conductive pads 632 are unlikely to contact each other due to the presence of the void 637, the units of electrically conductive adhesive 141 can be extended lengthwise in the Z'-axis direction. This extension increases contact area between each unit of electrically conductive adhesive 141 and the respective conductive pad 632 and increases shock-resistance of the quartz-crystal device.

The quartz-crystal plate 630 can be a mesa-type including a vibrating portion 134a and a peripheral portion 134b that surrounds the vibrating portion 134a and that is thinner than the vibrating portion 134a. In this embodiment, the void 637 desirably is defined on the peripheral portion 134b, not on the vibrating portion 134a. The vibrating portion vibrates at a predetermined vibrating frequency.

Although various embodiments of the present invention were explained in detail above, the invention can also be realized by adding various changes and modifications within the scope of the technology, as would be clear to persons of ordinary skill in the art.

In this specification, although the various embodiments have been described in the context of AT-cut quartz-crystal vibrating pieces, it will be understood that the embodiments can be applied with equal facility to piezoelectric materials such as BT-cut that vibrates in thickness-shear mode. Further, the piezoelectric vibrating piece can be applied not only to the quartz-crystal materials, but also to the piezoelectric materials such as lithium tantalite and lithium niobate.

What is claimed is:

1. A quartz-crystal device, comprising:
   a rectangular quartz-crystal plate having a long-edge, a short-edge, a first main surface, and a second main surface;
   a respective excitation electrode situated on each of the first and second main surfaces of the quartz-crystal plate;
   a respective conductive pad electrically connected to each excitation electrode and extending to the short-edge of the quartz-crystal plate;
   a package having a mounting surface, a pair of mounting terminals situated on the mounting surface, and respective connecting electrodes electrically connected to the respective mounting terminals; and
   respective units of electrically conductive adhesive bonding together the connecting electrodes and respective conductive pads to thereby mount the quartz-crystal plate in the package;
   wherein a shortest distance between an edge of a unit of electrically conductive adhesive and an opposing edge of the excitation electrode is in a range of 10% to 15% the length of the quartz-crystal plate in the long-edge direction.

2. The quartz-crystal device of claim 1, wherein the units of electrically conductive adhesive bond the conductive pads to respective connecting terminals at multiple bonding locations.

3. The quartz-crystal device of claim 2, wherein the conductive pads are arranged along respective short-edge directions of the quartz-crystal plate, or along one short-edge direction.

4. The quartz-crystal device of claim 2, wherein the bonding locations are aligned along the short-edge direction.

5. The quartz-crystal device of claim 4, wherein the conductive pads are arranged along respective short-edge directions of the quartz-crystal plate, or along one short-edge direction.

6. The quartz-crystal device of claim 4, wherein:
   the conductive pads are arranged along one edge of the quartz-crystal plate;
   a void is defined between the conductive pads; and
   the void extends through the quartz-crystal plate in a thickness direction.

7. The quartz-crystal device of claim 4, wherein:
   the quartz-crystal plate comprises first and second principal surfaces on which respective excitation electrodes are situated;
   a step extends outward from a principal surface;
   at least a portion of each conductive pad is located on the step;
   at least one respective unit of electrically conductive adhesive is bonded onto each conductive pad formed on the step; and
   the quartz-crystal plate is mounted in the package.

8. The quartz-crystal device of claim 4, further comprising a respective protrusion situated at each conductive pad, the protrusion separating the short-edge side of the quartz-crystal plate and the respective excitation electrode; wherein a shortest distance between a surface facing the short-edge direction of the protrusion and an edge of the excitation electrode in the long-edge direction is in a range of 10% to 15% the length of the long-edge of the quartz-crystal plate.

9. The quartz-crystal device of claim 2, wherein:
   the conductive pads are arranged along one edge of the quartz-crystal plate;
   a void is defined between the conductive pads; and
   the void extends through the quartz-crystal plate in a thickness direction.

10. The quartz-crystal device of claim 2, wherein:
    the quartz-crystal plate comprises first and second principal surfaces on which respective excitation electrodes are situated;
    a step extends outward from a principal surface;
    at least a portion of each conductive pad is located on the step;
    at least one respective unit of electrically conductive adhesive is bonded onto each conductive pad formed on the step; and
    the quartz-crystal plate is mounted in the package.

11. The quartz-crystal device of claim 2, further comprising a respective protrusion situated at each conductive pad, the protrusion separating the short-edge side of the quartz-crystal plate and the respective excitation electrode; wherein a shortest distance between a surface facing the short-edge direction of the protrusion and an edge of the excitation electrode in the long-edge direction is in a range of 10% to 15% the length of the long-edge of the quartz-crystal plate.

12. The quartz-crystal device of claim 1, wherein the conductive pads are arranged along respective short-edge directions of the quartz-crystal plate, or along one short-edge direction.

13. The quartz-crystal device of claim 12, wherein:
    the quartz-crystal plate comprises first and second principal surfaces on which respective excitation electrodes are situated;
    a step extends outward from a principal surface;
    at least a portion of each conductive pad is located on the step;
    at least one respective unit of electrically conductive adhesive is bonded onto each conductive pad formed on the step; and
    the quartz-crystal plate is mounted in the package.

14. The quartz-crystal device of claim 12, further comprising a respective protrusion situated at each conductive pad, the protrusion separating the short-edge side of the quartz-crystal plate and the respective excitation electrode; wherein a shortest distance between a surface facing the short-edge direction of the protrusion and an edge of the excitation electrode in the long-edge direction is in a range of 10% to 15% the length of the long-edge of the quartz-crystal plate.

15. The quartz-crystal device of claim 1, wherein:
the conductive pads are arranged along one edge of the quartz-crystal plate;
a void is defined between the conductive pads; and
the void extends through the quartz-crystal plate in a thickness direction.

16. The quartz-crystal device of claim 15, wherein:
the quartz-crystal plate comprises first and second principal surfaces on which respective excitation electrodes are situated;
a step extends outward from a principal surface;
at least a portion of each conductive pad is located on the step;
at least one respective unit of electrically conductive adhesive is bonded onto each conductive pad formed on the step; and
the quartz-crystal plate is mounted in the package.

17. The quartz-crystal device of claim 15, further comprising a respective protrusion situated at each conductive pad, the protrusion separating the short-edge side of the quartz-crystal plate and the respective excitation electrode; wherein a shortest distance between a surface facing the short-edge direction of the protrusion and an edge of the excitation electrode in the long-edge direction is in a range of 10% to 15% the length of the long-edge of the quartz-crystal plate.

18. The quartz-crystal device of claim 1, wherein:
the quartz-crystal plate comprises first and second principal surfaces on which respective excitation electrodes are situated;
a step extends outward from a principal surface;
at least a portion of each conductive pad is located on the step;
at least one respective unit of electrically conductive adhesive is bonded onto each conductive pad formed on the step; and
the quartz-crystal plate is mounted in the package.

19. The quartz-crystal device of claim 1, further comprising a respective protrusion situated at each conductive pad, the protrusion separating the short-edge side of the quartz-crystal plate and the respective excitation electrode; wherein a shortest distance between a surface facing the short-edge direction of the protrusion and an edge of the excitation electrode in the long-edge direction is in a range of 10% to 15% the length of the long-edge of the quartz-crystal plate.

20. The quartz-crystal device of claim 19, wherein a cross-section of the surface facing the short-edge direction of the protrusion that is parallel to the principal surfaces of the quartz-crystal plate includes a portion of a circle having a center situated on the short-edge side of the protruding portion.

* * * * *